United States Patent
Mir et al.

(10) Patent No.: US 6,424,093 B1
(45) Date of Patent: Jul. 23, 2002

(54) ORGANIC ELECTROLUMINESCENT DISPLAY DEVICE WITH PERFORMED IMAGES

(75) Inventors: Jose M. Mir, Rochester; Lee W. Tutt, Webster; Robert B. Bilhorn, Fairport; Myron W. Culver, Rochester, all of NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/684,193

(22) Filed: Oct. 6, 2000

(51) Int. Cl.[7] ............................................... G09G 3/12
(52) U.S. Cl. ..................... 315/169.3; 313/506
(58) Field of Search ..................... 315/169.3, 169.1, 315/169.4; 345/76, 82, 83; 313/500, 503, 504, 506; 396/287; 428/690

(56) References Cited

U.S. PATENT DOCUMENTS

| | | | |
|---|---|---|---|
| 4,356,429 A | 10/1982 | Tang | 313/503 |
| 4,539,507 A | 9/1985 | VanSlyke et al. | 313/504 |
| 4,720,432 A | 1/1988 | VanSlyke et al. | 428/457 |
| 4,769,292 A | 9/1988 | Tang et al. | 428/690 |
| 5,041,326 A | 8/1991 | Schroeder et al. | 428/161 |
| 5,150,006 A | 9/1992 | VanSlyke et al. | 313/504 |
| 5,151,629 A * | 9/1992 | VanSlyke | 313/504 |
| 5,552,678 A | 9/1996 | Tang et al. | 315/169.3 |
| 5,554,450 A | 9/1996 | Shi et al. | 428/690 |
| 5,593,788 A | 1/1997 | Shi et al. | 428/690 |
| 5,652,930 A * | 7/1997 | Teremy et al. | 396/287 |
| 5,684,365 A | 11/1997 | Tang et al. | 315/169.3 |
| 6,137,221 A * | 10/2000 | Roitman et al. | 313/504 |

FOREIGN PATENT DOCUMENTS

WO      WO 97/06223      * 2/1997

* cited by examiner

*Primary Examiner*—Don Wong
*Assistant Examiner*—Ephrem Alemu
(74) *Attorney, Agent, or Firm*—Raymond L. Owens

(57) ABSTRACT

An organic electroluminescent display device that displays a preformed image includes spaced anode and cathode electrodes, organic electrically conductive hole transport layer and electron transport layer disposed between the anode and cathode electrodes, and a preformed image layer formed between the organic electrically conductive hole transport layer and electron transport layers such layer having a region that is preformed to have at least one preformed image such that when a voltage is applied across the anode and cathode electrodes which will cause a preformed image to be displayed. Voltages are applied across the anode and cathode electrodes of the organic electroluminescent display device causes the emission of light for viewing the preformed image.

7 Claims, 3 Drawing Sheets

FIG. I

ORGANIC ELECTROLUMINESCENT DISPLAY DEVICE WITH PERFORMED IMAGES

FIELD OF THE INVENTION

The present invention relates to organic electroluminescent display devices with preformed images.

BACKGROUND OF THE INVENTION

Photographic images are commonly printed on paper, fabric, ceramics and other substrate media that provide a reflective or transmissive substrate for the handling and viewing of said images. These substrates often include a reflective surface as background that allows direct viewing of the images using ambient light or other forms of applied illumination. Transparency photographic media such as slides or transparency display media require a lit backing or projecting system that illuminates said transparency media to either view directly (displays) or project onto screens (slides). The choice for the type of photographic medium depends on the specific application, e.g. consumer images for home display, commercial billboards, lit advertising displays, or many others.

For either type of application, current media suffer a number of drawbacks. Reflective photographic media require ambient illumination for viewing; a darkened living room, for example, may not provide sufficient illumination levels for enjoyable viewing. Transparency media, on the other hand, require the expense and additional bulk of light sources, view boxes, and associated subsystems. For projection displays, supplemental screens, darkened rooms, and optical projection systems are normally required.

Flat panel display technology has provided in some cases solutions to the illumination and bulk problem. Devices such as Liquid Crystal Displays (LCDs) are electronically-controlled transparencies that when back illuminated with thin profile light sources provide an integrated and reasonably compact system to view pictorial and graphical content. Unfortunately, LCD's have problems with brightness, angle of viewing and, although superior to the illuminated view box, are still bulky relative to a standard print on paper.

Organic Electroluminescent Display Devices (OEL's) are flat panel display media that do not require external illumination sources and hence are advantaged in compactness and power consumption. OEL's are also Lambertian emitters and do not exhibit significant angle viewing problems. Eastman Kodak U.S. Pat. Nos. 4,356,429 and 4,539,507 describe some OEL's device configurations and materials. In order to depict pictorial and other types of content on LCD's, OEL's, and other flat panel display devices, x-y addressable electronic subsystems are required to apply controlled voltages across the display medium that are representative of the image being displayed. Voltage applied across OEL's, for example, controls the amount of current that flows through a light emitting layer that produces light of color and brightness controlled by the chemical and physical characteristics of said layer. A multiplicity of colors can be achieved using OEL technology by chemical manipulation of the layers as taught in U.S. Pat. No. 4,769,292.

The specific voltage applied at an x-y location in flat panel display media can be controlled using a number of approaches. In the so-called passive matrix device, orthogonal sets of electrodes are sequentially addressed in a line-by-line manner with voltage levels that correspond to the image brightness desired at each specific x-y location of the display device. In the active matrix configuration, a set of addressable transistors is commonly defined on single crystal silicon or Si-on-glass (thin film transistors). The transistors are switched to supply voltages across the active area display medium. U.S. Pat. No. 5,684,365 describes an active matrix display that uses organic electroluminescent materials for the display medium.

There are many applications where it is desired to display single or preformed emissive images using a low cost display device. Some applications include point of purchase displays, signs, and even traditional consumer photography. Although flat panel displays are more flexible in their ability to display arbitrary and changeable content that their traditional printed or photographic counterparts, their cost is still relatively high due to device complexity, the electronic interconnections, and the driving circuitry required. Flat panel displays become extremely expensive at the larger sizes due to the semiconductor processes used to fabricate them and the fact that cost scales with display area. The need for high resolution increases the multiplicity and complexity of the drive electronics, resulting in further additional cost.

It would therefore be desirable to have a low cost, large area emissive device capable of displaying high quality preformed images. Ideally, such a display would be produced using low cost printing technology similar to photographic, thermal transfer, offset printing, ink jet to name a few. In fact, it would be desirable if such a display "device" would have the availability and price point closer to a "consumable" such as a photographs, transparencies, or printed material.

U.S. Pat. No. 5,041,326 to Schroder et al. discloses an electroluminescent laminate assembly that may be used to display preformed emissive images. The luminescent laminate assembly is defined using a layer having light emitting particles, said layer interposed between a pair of electrically conducting matter electrodes, at least one of them being transmissive to the emitted light. Different gradations of light intensity are achieved by spatially controlling the thickness of the light emitting layer and of the electrically conducting matter. Further, the color or hue of the image may be controlled by modifying the thickness and color of the light emitting particles in accordance to the color or hue desired. The defined patterns are produced using masking, doctor-blading, embossing, and/or spraying processes. Although this assembly is capable of forming preformed images, it is best suited to display simple drawings, graphics, and patterns. Furthermore, since in accordance to their claims, the thickness or concentration of at least one of the electrode layers must be varied to modulate light output, the brightness and color spectrum of the image cannot be controlled independently to achieve their full brightness and spectral ranges. Finally, Schroder et al. do not specifically teach a way to achieve a high quality continuous tone images using their invention.

SUMMARY OF THE INVENTION

It is therefore an object of the present invention to provide a display device with preformed images that offers the advantages in compactness and ease of viewing of emissive flat panel displays having preformed continuous tone images It is a further object of the present invention to make use of the advantages of organic electroluminescent display devices to form preformed images.

Another object of the invention is to provide large scaleable flat panel emissive display devices that have preformed images and can be easily mounted onto standard photographic picture frames, not much thicker than the glass cover of traditional picture frames.

It is a further object of this invention to provide consumers a conveniently method to obtain light emissive images from pictures using photographs of their choice and standard photographic fulfillment channels.

These objects are achieved by an organic electroluminescent display device that displays a preformed image, comprising:

a) spaced anode and cathode electrodes;

b) organic electrically conductive hole transport layer and electron transport layer disposed between the anode and cathode electrodes;

c) a preformed image layer formed between the organic electrically conductive hole transport layer and electron transport layers such layer having a region that is preformed to have at least one characteristic such that when a voltage is applied across the anode and cathode electrodes which will cause a preformed image to be displayed; and d) means for applying a voltage to the anode and cathode electrodes to cause the emission of light to display the preformed image.

ADVANTAGES

It is an advantage of the present invention that by having a layer with a preformed image and using such layer in an organic electroluminescent display device, high resolution full color preformed images can be effectively displayed.

The present invention does not require electronic addressing systems, complex electronic support components and interconnects, or bulky and expensive light emitting or projection systems.

Another advantage of the present invention is that the display devices in accordance with the present invention can be made so as to have the cost and usability akin of a consumable media.

Another advantage of the present invention is that the display devices in accordance with the present invention are able to display high quality continuous tone color images that exhibit fully controlled color gamut and brightness.

DETAILED DESCRIPTION OF THE INVENTION

Figure 1:
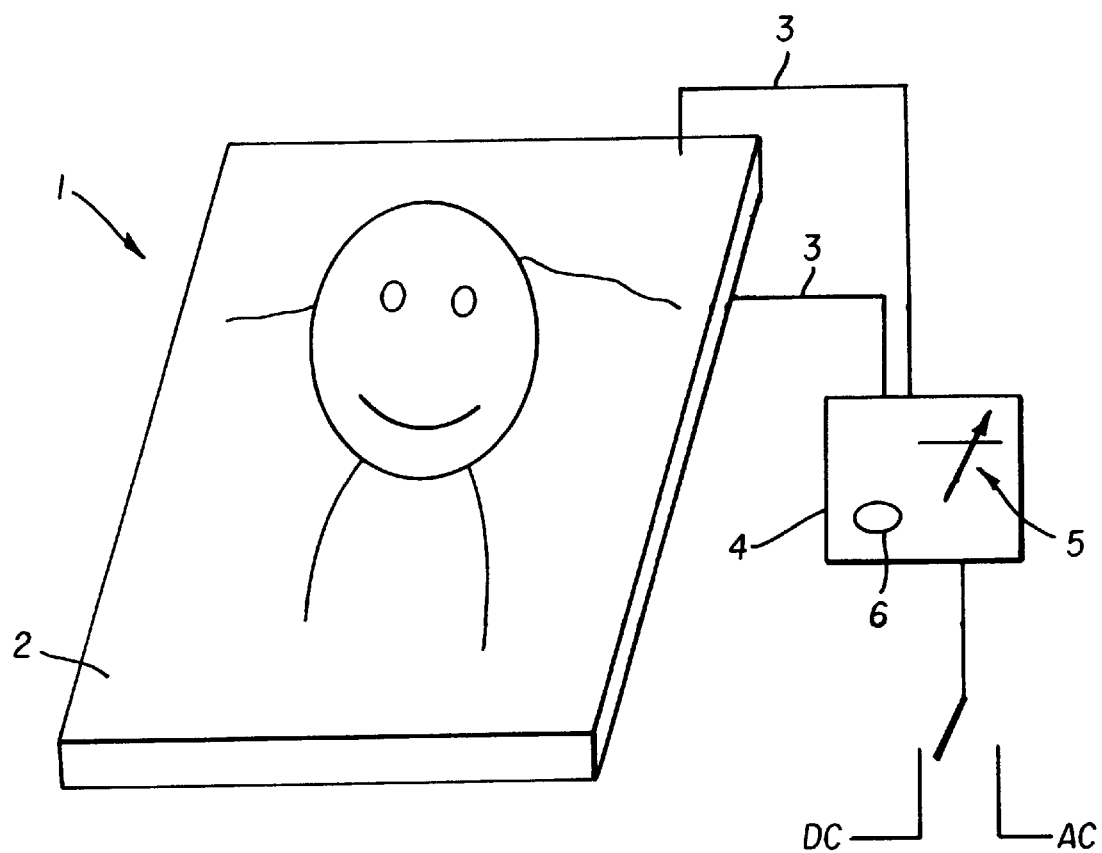
FIG. 1 is a schematic representation of an organic luminescent display device in accordance with the present invention.

Different embodiments of the present invention will now be described. Where parts correspond to those in FIG. 1, the same reference numerals will be used. FIG. 1 depicts an organic electroluminescent device with preformed image. The display area 2 is composed of an organic electroluminescent display device with preformed image that requires a single drive signal supplied through leads 3. The drive signal is controlled using brightness control device 4. The brightness control device can operate either manually using a rheostat 5 or with sensing device 6 that automatically supplies the required drive signal to allow proper viewing depending on ambient lighting conditions. The power source to the organic luminescent device with preformed image can consist of a battery, some type of rectified or AC signal (see for example U.S. Pat. No. 5,552,678). In accordance to OEL prior art, the drive signal supplied to the device is preferably a calibrated current source in order to achieve optimal control of the overall display brightness.

Figure 2:
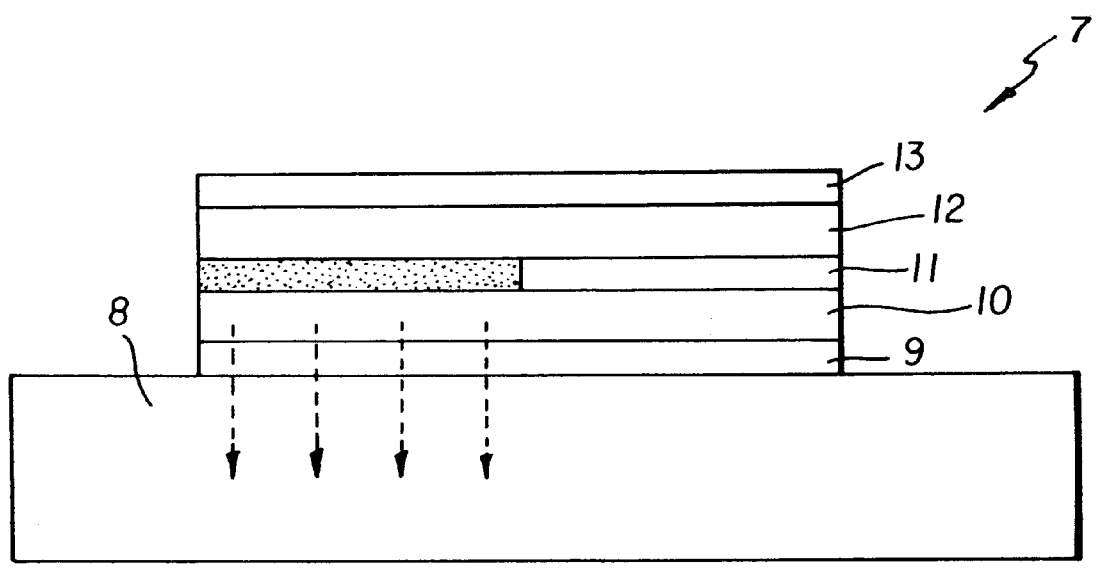
FIGS. 2 and 3 are cross sectional views of different embodiments of organic luminescent display devices of present invention.

Referring to FIG. 2, a cross-section of an organic electroluminescent device 7 is shown. A multilayer structure is shown supported on a transparent substrate 8. The transparent substrate can be made of glass, plastic, transparent ceramic or any other medium of suitable transparency and mechanical strength for handling. Although not shown, the device 7 may be hermetically encapsulated to avoid the possibility of reactivity with water or other contaminants. A set of layers reside on the substrate starting with transparent anode 9 (e.g. indium tin oxide, ITO), hole transport layer(s) 10, preformed image layer 11 containing one or more luminescent species, electron transport layer 12, and metallic cathode 13 (e.g. Mg/Ag, LiF/Al). Hole transport and electron transport layers are well known in OLED device art. See, for example, commonly assigned U.S. Pat. Nos. 4,720,432 and 5,554,450 for useful composition and range of operation. Likewise, there are several luminescent species-described in the prior art which emit light throughout a useful spectral range (see, for example, U.S. Pat. Nos. 4,769,292, 5,150,006, and 5,593,788).

In the specific geometry of FIG. 2, the concentration of the luminescent specie in the preformed image layer has been controlled patterned in accordance to the emission desired at each position on the display structure (spatially patterned). For example, in the limit of no emission, i.e. a dark region, the amount of luminescent specie in the preformed image layer would be zero or below a threshold needed to detect the emitted light. A bright region would result from an optimal amount or concentration of the luminescent specie in the spatially patterned emissive layer. Activation of the device is achieved by applying a uniform drive signal across the two electrodes and allowing the preformed image layer to emit light in accordance to the concentration of the luminescent specie. In FIG. 2, the left region (shown as cross-hatched) has a higher concentration of the luminescent specie than the right (dashed) and will therefore emit more light per area than the right region. Similarly, the left and right emitting regions of FIG. 2 can be formed using different color luminescent species to achieve emission in different parts of the spectrum. It is important to note that in both of these examples, the difference in emission is achieved by the chemistry and structure of the preformed image layer rather than by varying the drive voltage signals across the display area as is commonly practiced in flat panel display art.

The configuration of the device in FIG. 2 provides a monochrome device if a single luminescent specie is used in the preformed image layer, multiple luminescent species (e.g. red, green, blue RGB emissive materials) can be used to produce color devices. Variation of the relative amounts of the color luminescent species across the device results in concomitant variations of the spectral properties. For example, assuming a device with RGB luminescent species, a local area with relative low concentration of red emitter would emit light with a greater spectral content in the green an green and blue parts of the spectrum, all else being equal.

It is appreciated that for some chemical systems the luminescent species may be mixed chemically or perhaps deposited as a layered structure.

Figure 3:
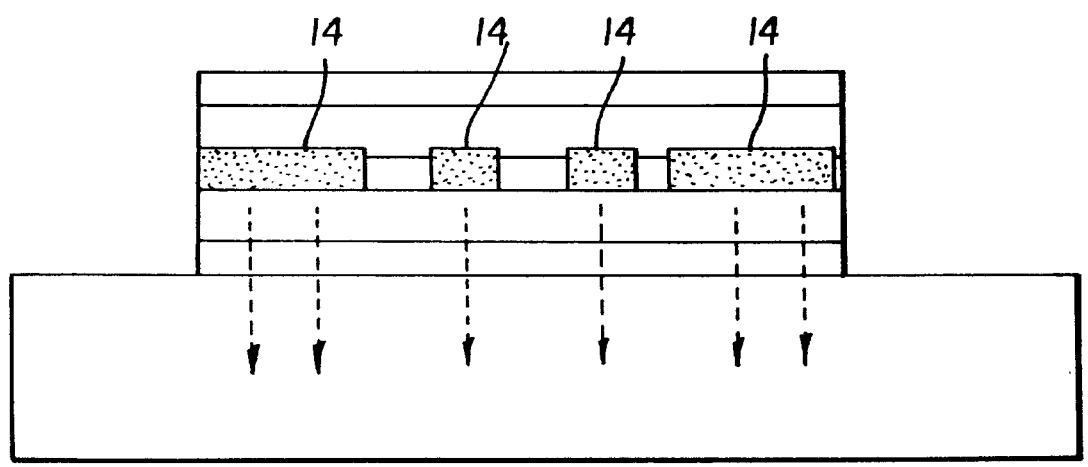

Alternative approaches can be used to spatially pattern the emission of the device. Although the example shown in FIG. 2 may be used effectively for an on-off (1 bit grayscale) image, since the emission of OEL devices varies strongly with the concentration of the luminescent specie, continuous tone images may be hard to control accurately. An alternative and preferred embodiment is shown in FIG. 3, where the preformed image layer is made of patterned emitting units 14. This structure may be fabricated either by depositing the luminescent specie in the desired pattern or by depositing a continuous layer of the luminescent specie and "quenching" its luminescent properties where it is not wanted. If these patterned emitting units are made small compared to the resolution of the human eye, a "halftone" emissive pattern may be produced analogous to what is done in conventional printed media. In practice, the spatial frequency of the halftone pattern varies depending on the application. Newspapers, for example, are printed using approximately a halftone frequency of 85 ppi. Magazines require higher quality, approximately 150 ppi, whereas the high end of printed media uses a halftone frequency of approximately 28 ppi. In such halftone systems, regions with small or no patterned emitting units are viewed as dark regions. Conversely, regions with large or continuous patterned emitting units appear as bright regions. When the patterned emitting units are grouped as different colors, they are known as a plurality of units.

Figure 4:
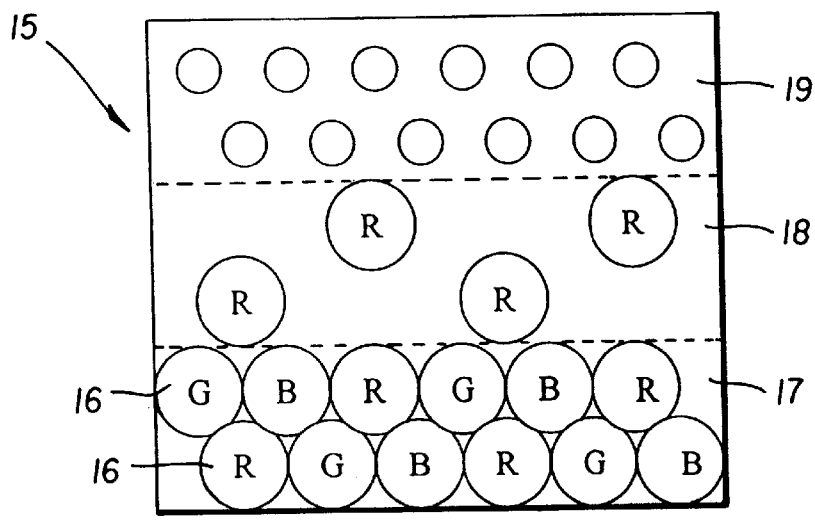
FIG. 4. depicts an embodiment using full color halftones in an organic luminescent display device in accordance with the present invention.

FIG. 4 shows for illustration purposes the structure of a preformed image layer 15 which uses a full color halftone. In FIG. 4, the plurality of units are "triads" represented by red, green, and blue (RGB) patterned emitting units 16; their relative areas being determined by the brightness and spectral emission of the specific preformed image. The example illustrates three "striped" regions with different spectral and brightness characteristics. Stripe 17, for example shows RGB triads that cover most of the area available to them. The concentration of the luminescent specie in these patterned emitting units is typically chosen such that they result in close to optimal emission when addressed with the applied drive signal. Since this is an additive color system, the emission spectrum will be approximately white, if the RGB luminescent species are well matched. Stripe 18 shows only the red component of the triad present, resulting in red emission. Stripe 19 shows all RGB patterned emitting units of the triad present, but smaller in area than those in stripe 17. The emission spectrum is therefore similar to that of stripe 17, but dimmer in intensity (gray). Using principles of additive color systems, arbitrary colors and intensities within the dynamic range of the device are possible. Obviously, other additive color configurations other than triads (e.g. stripes, honeycombs, triangles, etc.) may be used.

In fabrication of these multilayer structures it is important to properly deposit the preformed image layer. Well known methods of depositing layers such as evaporation through masks, stencils, laser thermal deposition, ink jet and other methods known in the art could be employed to deposit layers 11, and 15 and patterned emitting units 14 depicted in FIGS. 2–4. The amount and location of the luminescent specie needs to be carefully controlled in order to render the desired brightness and color and reproduce a faithful facsimile of the desired image. In the case of the halftone display system, a digital halftone printing system could be employed to write the preformed image layer. Typically the printer resolution needed to achieve high quality pictorial images using a halftone pattern of frequency n dpi is about ten times the halftone frequency, i.e. 10 n dpi. For example, an 85 dpi halftone as used in newspaper media would require an 850 dpi resolution printer. All digital halftone methods effectively trade off grayscale resolution at the expense of spatial resolution. Algorithms such as matrix dithering, growing dot, dispersed dot, and error diffusion may be used with laser thermal, ink jet and other deposition methods to achieve the necessary number of steps needed by high quality images.

A particularly useful method to deposit the preformed image layer is laser thermal printing. In this approach, a focused infrared laser beam is used to transfer the luminescent specie from a donor layer to the organic electroluminescent display device. The receiver in this case is the transparent substrate containing the transparent anode electrode and hole transport layer. U.S. Pat. No. 5,688,551 teaches a close-spaced deposition method to transfer RGB luminescent species from donor layers to receivers. Two methods are described. In the first, a donor layer containing the luminescent specie has a pre-patterned light absorbing layer that is uniformly exposed by an intense light while in proximity to the receiver; causing the electroluminescent specie to transfer according to the said pattern. In the second, an unpatterned donor layer containing the luminescent specie is heated by an intense focused laser, causing the luminescent specie to transfer following the path of the laser. The path and intensity of the laser is controlled such that they create the desired halftone of continuous tone patterns required to display the image. Typically, focused beams in the 10 micron range or less are easily achievable, yielding printing resolutions in the 2500 dpi range. Laser thermal deposition is therefore especially well suited for reproducing high resolution continuous tone and even halftone images. To finish the fabrication of the device, the electron transport layer and the metallic cathode are deposited using well known techniques that have been extensively disclosed in OEL prior art.

Figure 5:
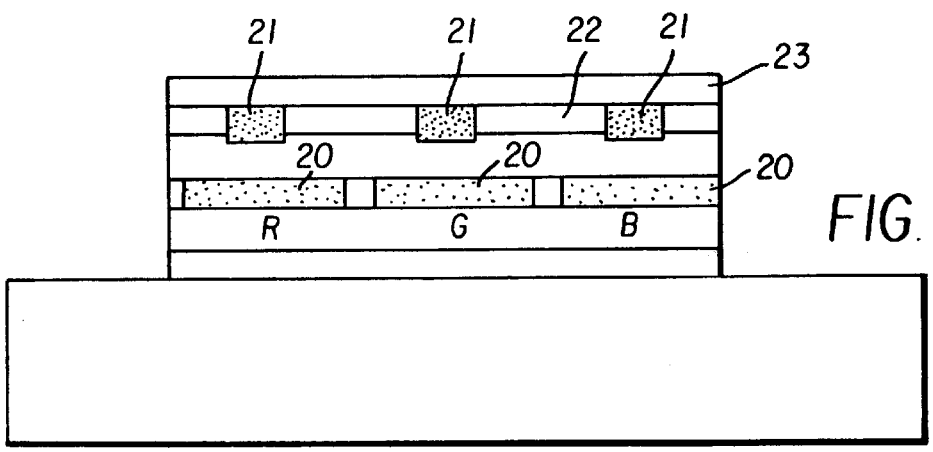
FIG. 5 is a cross sectional view of an embodiment of an organic luminescent display device of present invention.

Still another variation to the electroluminescent display device is shown in FIG. 5. Similarly to the example shown in FIGS. 3 and 4, light emission is modulated in an area-wise manner. In this case however, there are equal area RGB patterned emitter units 20, covered by a uniform electron transport layer, and capped with aligned variable area cathode electrodes 21. Adjacent to the cathode electrode units, exists an insulating continuous layer 22 that prevents current flow from a top contact electrode 23 to flow in those areas. Grayscale in this example is controlled by changing the area of the variable area cathodes 21. Small electrodes result in low emission by the underlying luminescent specie, while large electrodes result in high emission by the underlying luminescent specie. It can be appreciated that this method is useful for both monochrome and color systems. Although FIG. 5 depicts a patterned cathode electrode, the same method may be implemented with a patterned anode electrode.

EXAMPLE 1

Figure 6:
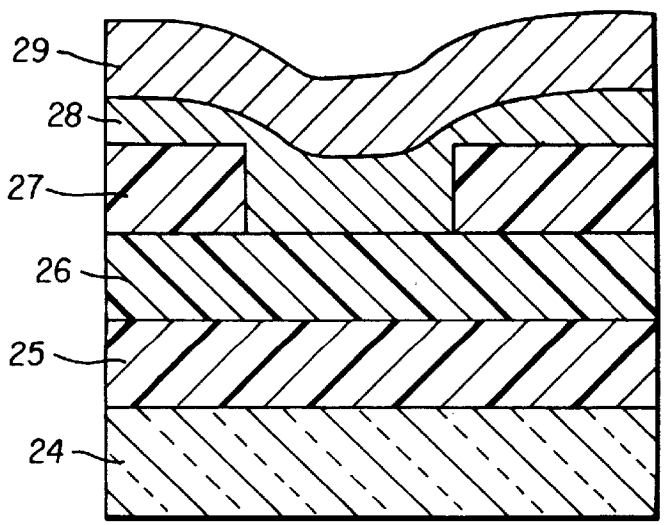
FIG. 6 depicts, in cross section, a portion of an organic luminescent display device made in Example 1.

See FIG. 6

A donor composite was formed by the vacuum deposition of an absorption layer of 2000–4000 angstroms of silver/indium tin oxide (ITO) on a 5 mil polyimide substrate. Onto this was vacuum deposited a 1500 angstroms thick layer of ALQ (8-hydroxyquinoline) and 1% DCJTB (4-(dicyanomethylene)-2-t-butyl-6-(1,1,7,7-tetramethyljulolidyl-9-enyl)-4H-pyran).

As shown in FIG. 6A, clean glass substrate 24 was vacuum deposited through a mask with indium tin oxide (ITO) to pattern 400 to 800 angstrom transparent electrodes 25. A 1500 angstrom NPB (4,4'-bis-[N-(1-naphthyl)-N-phenylamino]-bi-phenyl) hole transport layer 26 was then vacuum deposited. A donor composite as previously described was placed in contact with the NPB layer.

Laser transfer of the light emissive material 27 was effected from the donor composite to the display substrate by irradiation of the donor composite through the substrate with an infrared beam. The beam size was approximately 16 microns by 80 microns to the $1/e^2$ point. The dwell time was 27 microseconds with a power density of ~500 mw. Transfer was effected in regions which were desired to be orange colored.

Onto the transferred light emissive material 27 from the donor composite, conductive material was vacuum deposited 375 angstroms of ALQ as the electron transport layer 28 followed by 200 angstroms of silver and 2000 angstroms of magnesium as the second electrode 29. FIG. 5 shows the structure which was applied.

Upon the application of 9 volts an orange emission was seen to occur. A control sample which had no laser irradiation of the donor glowed green indicating the absence of light emissive material. The orange emission on the experimental sample was in the form of an image which corresponded to the laser modulation and was a recognizable orange on green image.

The invention has been described in detail with particular reference to certain preferred embodiments thereof, but it will be understood that variations and modifications can be effected within the spirit and scope of the invention.

Parts List 2 display area
3 leads
4 control device
5 rheostat
6 sensing device
7 electroluminescent device
8 transparent substrate
9 transparent anode
10 hole transparent layer(s)
11 preformed image layer
12 electron transport layer
13 metallic cathode
14 patterned emitting units
15 preformed image layer
16 patterned emitting units
17 stripe of patterned emitting units
18 stripe of patterned emitting units
19 stripe of patterned emitting units
20 patterned emitter units
21 cathode electrodes
22 continuous layer
23 contact electrode
24 glass substrate
25 transparent electrodes
26 hole transport layer
27 transferred light emissive material
28 electron transport layer
29 second electrode

What is claimed is:

1. An organic electroluminescent display device that displays a preformed image, comprising:
 a) a single anode and a single cathode electrode spaced from each other;
 b) organic electrically conductive hole transport layer and
 c) a preformed patterned image layer disposed between the hole transport and electron transport layers and having different units formed of different color luminescent species which emit light in different areas of the spectrum to provide multicolor to a preformed image such that when a voltage is applied across the anode and cathode, electrodes cause a multicolor preformed patterned image to be displayed; and
 d) means for applying a voltage to the anode and cathode electrodes to cause the emission of light to display the preformed patterned image.

2. The organic light emitting display device of claim 1 wherein the color luminescent species include red, green, and blue color luminescent species.

3. The organic electroluminescent display device of claim 1 wherein the units of the preformed layer are formed of different color luminescent species which have different concentrations.

4. The organic light emitting display device of claim 1 wherein the units of the preformed layer have different color luminescent species which have different concentrations to provide a continuous tone image.

5. The organic electroluminescent display device of claim 1 wherein the preformed layer is provided with light emitting material which emits light and wherein in certain areas the preformed layer does not emit light in a spatial pattern to produce the preformed image.

6. The organic light emitting display device of claim 1 wherein the preformed layer includes luminescent species which have been quenched to prevent the emission of light in positions to define the units in the preformed image layer.

7. The organic electroluminescent display device of claim 1 wherein the units are of different sizes such that when a voltage are applied across the anode and cathode electrodes which will cause a preformed image to be displayed.

* * * * *

UNITED STATES PATENT AND TRADEMARK OFFICE
CERTIFICATE OF CORRECTION

PATENT NO. : 6,424,093 B1  Page 1 of 1
DATED : July 23, 2002
INVENTOR(S) : Mir et al.

It is certified that error appears in the above-identified patent and that said Letters Patent is hereby corrected as shown below:

<u>Title page,</u>
Item [54], Title should read: -- ORGANIC ELECTROLUMINESCENT DISPLAY DEVICE WITH PREFORMED IMAGES --
    1. An organic electroluminescent display device that displays a preformed image, comprising:
    a) a single anode and a single cathode electrode spaced from each other;
    b) organic electrically conductive hole transport layer and electron transport layer disposed between the anode and cathode electrodes;
    c) a preformed patterned image layer disposed between the hole transport and electron transport layers and having different units formed of different color luminescent species which emit light in different areas of the spectrum to provide multicolor to a preformed image such that when a voltage is applied across the anode and cathode, electrodes cause a multicolor preformed patterned image to be displayed; and
    d) means for applying a voltage to the anode and cathode electrodes to cause the emission of light to display the preformed patterned image.

Signed and Sealed this

Twelfth Day of November, 2002

Attest:

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,424,093 B1  Page 1 of 1
DATED : July 23, 2002
INVENTOR(S) : Mir et al.

It is certified that error appears in the above-identified patent and that said Letters Patent is hereby corrected as shown below:

<u>Title page,</u>
Item [54], Title should read: -- ORGANIC ELECTROLUMINESCENT DISPLAY DEVICE WITH PREFORMED IMAGES --

<u>Column 8,</u>
Line 12, Claim 1 should read:
    1. An organic electroluminescent display device that displays a preformed image, comprising:
    a) a single anode and a single cathode electrode spaced from each other;
    b) organic electrically conductive hole transport layer and electron transport layer disposed between the anode and cathode electrodes;
    c) a preformed patterned image layer disposed between the hole transport and electron transport layers and having different units formed of different color luminescent species which emit light in different areas of the spectrum to provide multicolor to a preformed image such that when a voltage is applied across the anode and cathode, electrodes cause a multicolor preformed patterned image to be displayed; and
    d) means for applying a voltage to the anode and cathode electrodes to cause the emission of light to display the preformed patterned image.

Signed and Sealed this

Seventeenth Day of December, 2002

JAMES E. ROGAN
*Director of the United States Patent and Trademark Office*